United States Patent
Pernigotti et al.

(10) Patent No.: US 6,469,561 B2
(45) Date of Patent: Oct. 22, 2002

(54) RAIL TO RAIL RECTIFYING INTEGRATOR

(75) Inventors: Elena Pernigotti, Turin; Alberto Poma; Carlo Protti, both of Pavia, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/910,145

(22) Filed: Jul. 20, 2001

(65) Prior Publication Data

US 2002/0070787 A1 Jun. 13, 2002

(30) Foreign Application Priority Data

Jul. 24, 2000 (EP) .............................. 00830521

(51) Int. Cl.[7] .............................. G06G 17/19
(52) U.S. Cl. ..................... 327/336; 327/337; 327/94
(58) Field of Search ................... 327/336, 337, 327/339, 343, 344, 91, 94, 96

(56) References Cited

U.S. PATENT DOCUMENTS

| | | | | |
|---|---|---|---|---|
| 3,934,182 A | * | 1/1976 | Donohue et al. .............. | 318/85 |
| 4,554,508 A | | 11/1985 | Haque ........................ | 329/101 |
| 5,281,860 A | | 1/1994 | Krenik et al. ................ | 327/407 |
| 5,614,851 A | | 3/1997 | Holzer et al. ................. | 327/58 |
| 6,064,054 A | * | 5/2000 | Waczynski et al. ......... | 250/214 |

FOREIGN PATENT DOCUMENTS

DE 3114770 11/1982 ........... G01R/19/04

OTHER PUBLICATIONS

Patent Abstracts of Japan, vol. 008, No. 139 (E–253), Jun. 28, 1984 & JP 59050612A, Hitachi Seisakusho KK, Mar. 23, 1984.

Patent Abstracts of Japan, vol. 011, No. 245 (E–531), Aug. 11, 1987 & JP 62058879A, Hitachi Ltd; Others: 01, Mar. 14, 1987.

Patent Abstracts of Japan, vol. 011, No. 294 (E–544), Sep. 22, 1987 & JP 62092774A, Hitachi Ltd; Others: 01, Apr. 28, 1987.

* cited by examiner

*Primary Examiner*—Tuan T. Lam
*Assistant Examiner*—Hiep Nguyen
(74) *Attorney, Agent, or Firm*—Lisa K. Jorgenson; Allen, Dyer, Doppelt, Milbrath & Gilchrist, P.A.

(57) ABSTRACT

A rectifying integrator of an input signal with full output dynamics, relative to a voltage reference intermediate with respect to the dynamics of the input signal, includes a first line of integration having at least one integrator for integrating that portion of the input signal that exceeds the voltage reference, and includes a hold capacitor coupled in cascade to the integrator. The rectifying integrator includes a second line of integration, identical to the first line of integration, for integrating that portion of the input signal that remains below the voltage reference. An adder output stage generates an output signal equal to the difference between the voltages existing on the hold capacitors of the first and second lines of integration.

35 Claims, 7 Drawing Sheets

RAIL TO RAIL RECTIFYING INTEGRATOR

FIELD OF THE INVENTION

The present invention relates to integrated circuits, and more particularly to a circuit for rectifying and integrating a signal relative to an intermediate reference voltage for outputting a rail-to-rail signal.

BACKGROUND OF THE INVENTION

Rectifying and integrating circuits for an alternating input voltage with respect to a reference voltage are used in many applications, and are included in many commercially available devices. A rectifying integrator circuit may be formed, as depicted in the basic scheme of FIG. 1a, by a rectifier connected in cascade to an integrator stage and a Sample&Hold stage. FIG. 1b is a graph illustrating the main signals of the rectifying integrator illustrated in FIG. 1a.

By using these three blocks alone it is possible to obtain an output voltage that varies between the voltage reference (Vref) and the maximum or the minimum input voltage, with a reduced dynamic range, rather than between the minimum and the maximum input voltage, as would be preferred. In particular, if the voltage reference corresponds to an intermediate value between the maximum and minimum input voltage Vin, the dynamic range of the output voltage is practically halved if compared to the maximum input dynamic range.

This drawback may be averted by placing in cascade to the three above mentioned blocks an output stage having a gain value equal to two and which also functions as a level shifter, thus obtaining an output voltage Vout with a full dynamic range. The disadvantage of this approach is that a gain stage placed at the end of the cascade lowers the signal/noise ratio.

This problem may be overcome by the use of a switched-capacitor integrator as shown in FIG. 2a, which also functions as a rectifier and level shifter. FIG. 2b is a graph illustrating the main signals of the switched-capacitor rectifier illustrated in FIG. 2a. The input voltage Vin is sampled on the capacitor $C_1$ with respect to the voltage reference Vref. The switches driven by the driving phases $\Phi_{2a}$ and $\Phi_{2b}$ of FIG. 2a connect the node of the capacitor C1 at the lowest potential to the inverting node of the operational amplifier, while the other node of the capacitor is connected to a common ground node Vgnd. Hence, the integration and rectification of the input voltage are carried out simultaneously because the integrating capacitor $C_2$ is always charged with voltages of the same sign, regardless of whether Vin is higher or lower than Vref.

The circuit of FIG. 2a provides for an output voltage with a full dynamic range, however there are two drawbacks. A first drawback is that the operational amplifier of the integrator functions with an input connected to ground Vgnd that is at the lowest voltage, thus originating imprecisions in presence of relatively small input signals.

A second drawback is that the switches exhibit parasitic capacitances which, when discharged, produces currents in opposition to the integrating current. This brings a below ground potential to the inverting input of the operational at the start of each half-period of integration.

SUMMARY OF THE INVENTION

In view of the foregoing background, it is an object of the present invention to provide a rectifying integrator for producing a full dynamic output voltage.

This and other objects, advantages and features of the present invention are provided by a rectifying integrator comprising a pair of integrators, both referenced by an intermediate voltage reference within the dynamic voltage range of the input signal, and which are coupled to a pair of respective hold capacitors. The hold capacitors respectively integrate the part of the input signal that either exceeds the voltage reference or remains below the voltage reference. The voltages on the hold capacitors are eventually combined to produce the desired output voltage.

Preferably, the two integrators are combined in a unique integrating stage that is formed according to an offset recovery switched-capacitance technique, using two integrating capacitors coupled to respective hold capacitors at the output of a single amplifier. The hold capacitors are alternately connected to the integration feedback line of the amplifier depending on whether the input voltage exceeds or remains below the voltage reference. The voltages on the hold capacitors which are respectively higher or lower than the voltage reference, are input to a voltage adder which produces an output voltage Vout corresponding to the difference between the voltages present on the two hold capacitors.

BRIEF DESCRIPTION OF THE DRAWINGS

The various aspects and advantages of the invention will be even clearer upon describing detailed embodiments of the invention and by referring to the attached drawings, wherein:

FIG. 1b is a graph illustrating the main signals of the rectifying integrator illustrated in FIG. 1a;

FIG. 2b is a graph illustrating the main signals of the switched-capacitor rectifier and integrator illustrated in FIG. 2a;

DETAILED DESCRIPTION OF THE PREFERRED EMBODIMENTS

Figure 1A:
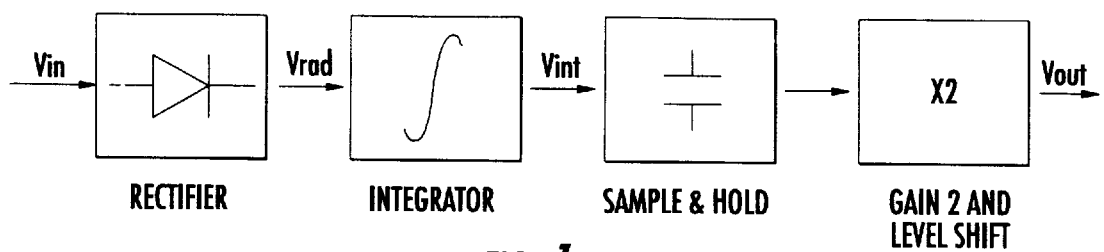
FIG. 1a is a functional block diagram of a rectifying integrator according to the prior art.
Figure 1B:
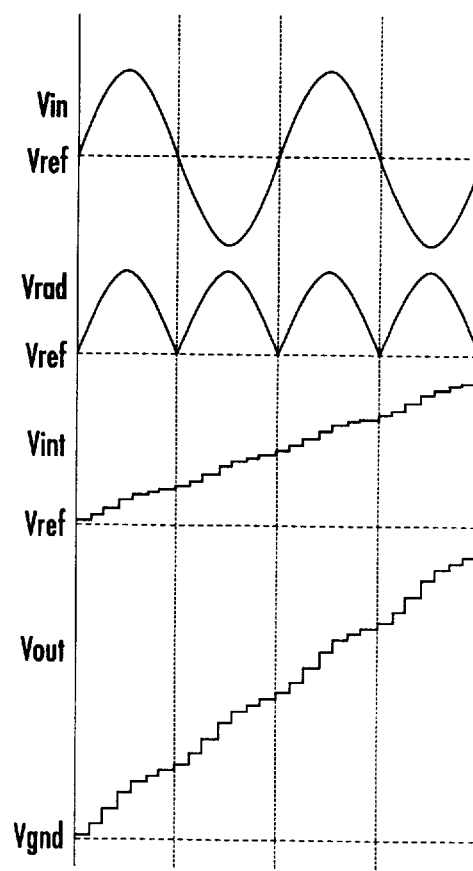
Figure 2A:
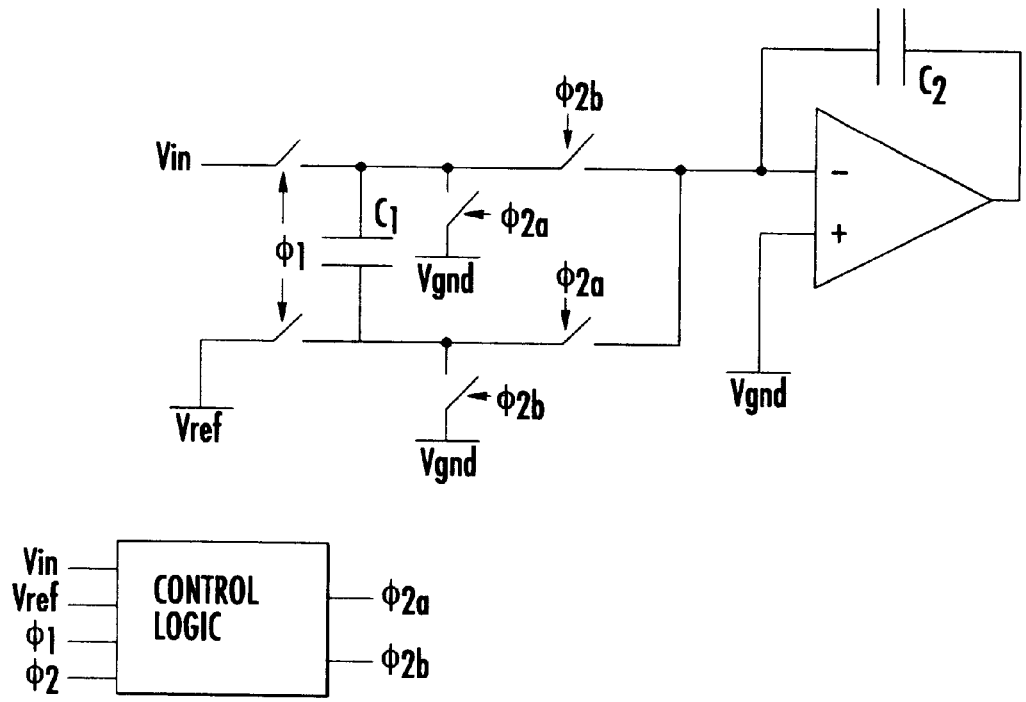
FIG. 2a is a detailed schematic diagram illustrating a switched-capacitor rectifier and integrator according to the prior art.
Figure 2B:
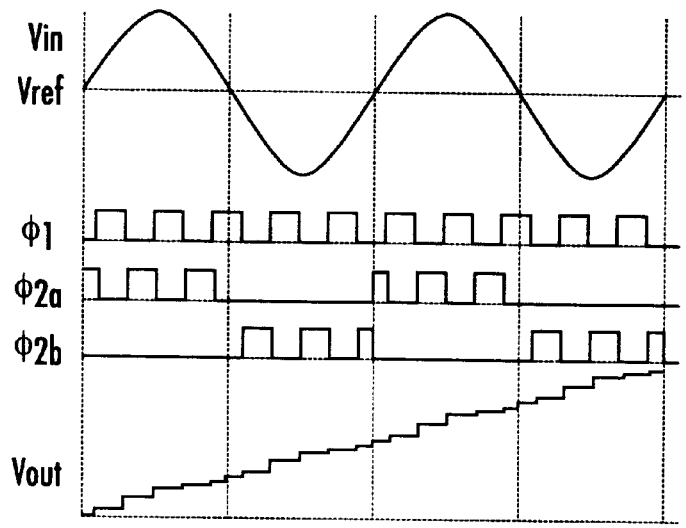
Figure 3A:
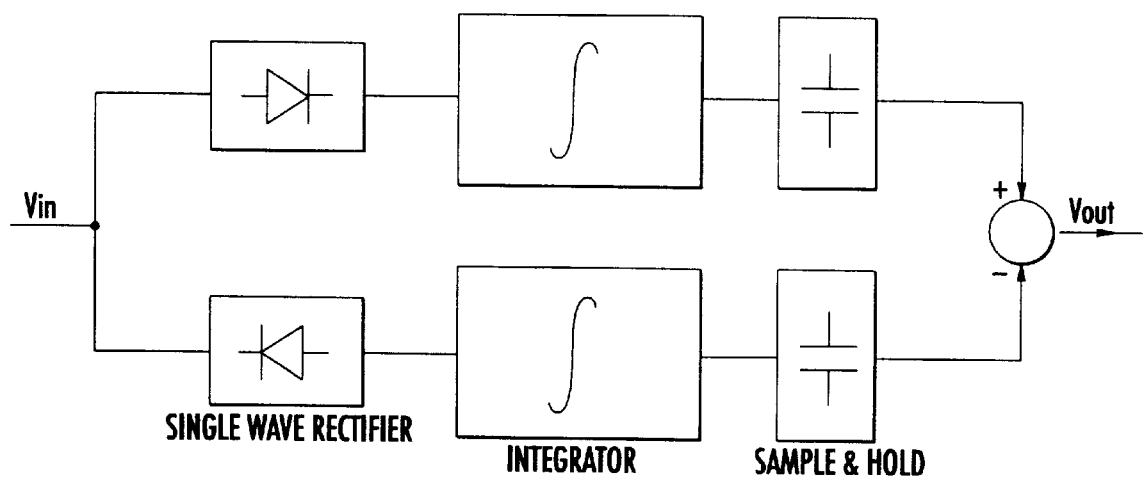
FIG. 3a is a basic functional block diagram of the circuit according to the present invention.

The basic functional scheme of the circuit of the present invention is shown in FIG. 3a. The two half-wave rectifiers feed two functionally distinct integrators. Both of the integrators are referenced by the voltage reference Vref with respect to the variation of the voltage range of the input signal Vin, and with the respective portions of the input signal that exceed or are lower than the voltage Vref.

Therefore, each integrator is input with a signal that is always of the same order of magnitude of the voltage reference Vref, so that the hold capacitors SAMPLE&HOLD will be charged with voltages having opposite signs and having a dynamic swing that is substantially halved as compared to the dynamic range of the input signal. By subtracting the voltages present on the two hold capacitors by an adder, an output voltage Vout with a maximum dynamic range is obtained.

Preferably, the circuit of the invention is formed using a unique integrator based upon a common switched-capacitance technique to eliminate offset effects. Two integrating capacitors are alternately switched to the line of integration depending on whether the voltage Vin exceeds or is lower than the voltage reference Vref, causing each capacitor to be always charged at voltages of the same sign.

On the output node of the integrator amplifier there will be alternately two voltages, both having a relatively reduced dynamic range and with one increasing and the other decreasing, and which will be stored in the respective hold capacitors. An adder combines such voltages for generating an output voltage having a full dynamic range.

Figure 3B:
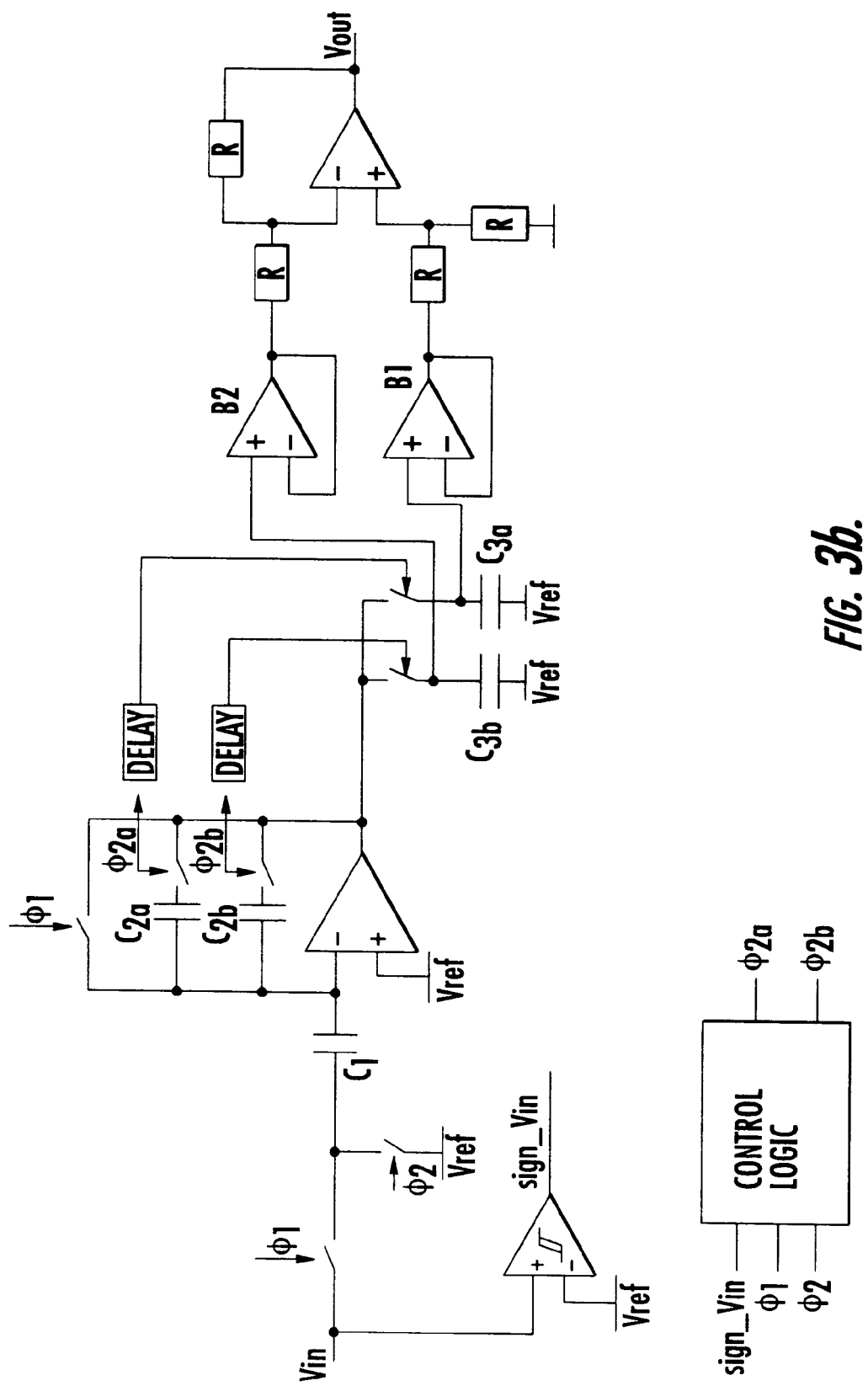
FIG. 3b is a detailed schematic diagram illustrating one embodiment of the circuit according to the present invention.

A first practical embodiment of the circuit of the invention is shown in FIG. 3b. The switched input capacitor $C_1$ is alternately connected to the input voltage and to the voltage reference by driving in phase opposition two switches by the two driving phases signals $\Phi_1$ and $\Phi_2$. A CONTROL_LOGIC circuit generates sub-phases $\Phi_{2a}$ and $\Phi_{2b}$ of the primary driving phase $\Phi_2$ as a function of the two primary driving phases $\Phi_1$ and $\Phi_2$ and as a function of the ratio Vin/Vref.

Figure 4:
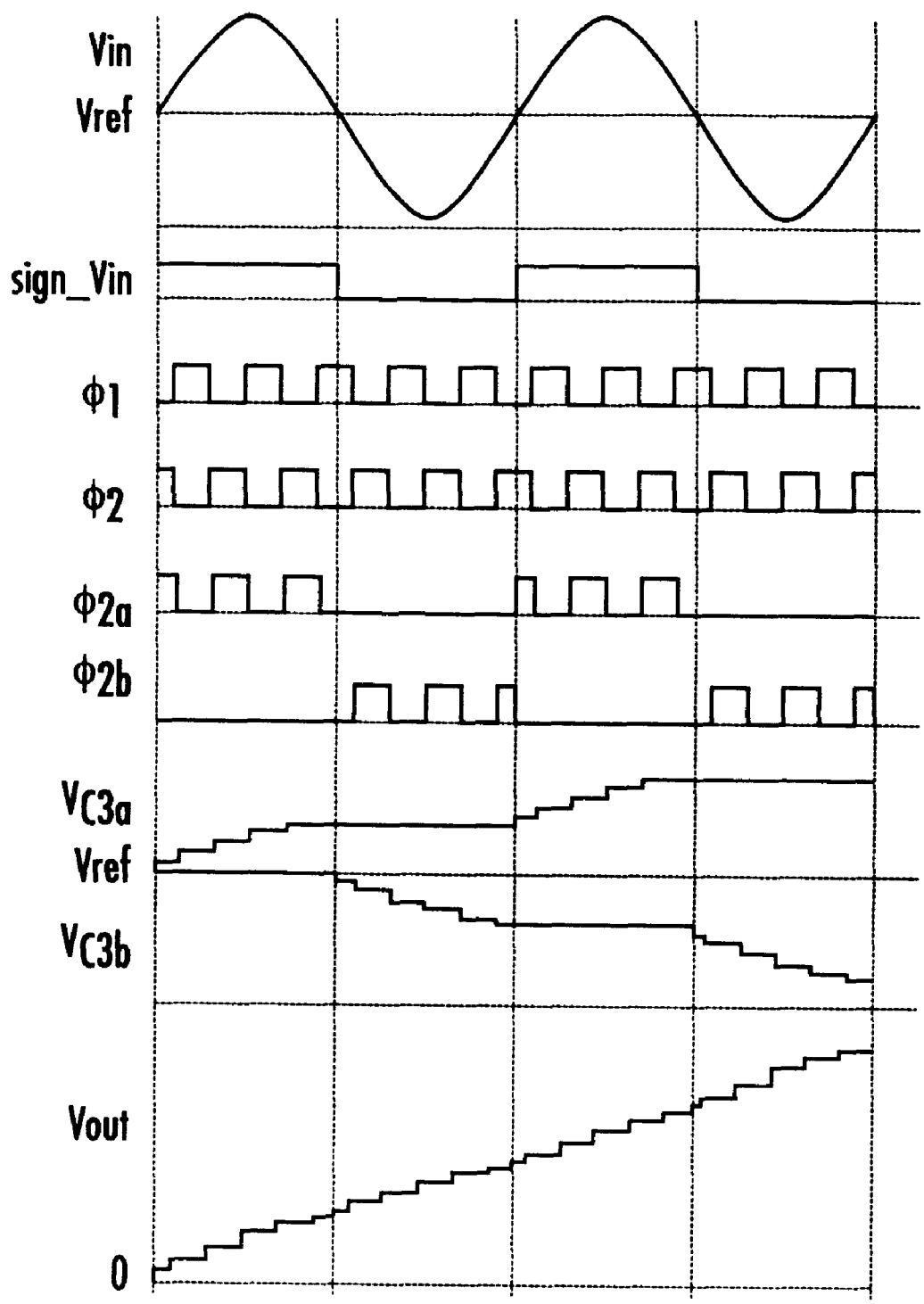
FIG. 4 is a graph illustrating the main signals of the circuit illustrated in FIG. 3b.

Two integrating capacitors $C_{2a}$ and $C_{2b}$ are alternately connected to the line of integration of the operational amplifier by the complementary switching of respective switches driven by the sub-phases $\Phi_{2a}$ and $\Phi_{2b}$, as illustrated in the timing diagrams of FIG. 4. Each integrating capacitor is coupled to a respective hold capacitor $C_{3a}$ and $C_{3b}$, connected to the output of the amplifier by a switch that is switched after a certain delay from the sub-phase that drives the respective integrating capacitor.

In the example of FIG. 4, when the input voltage exceeds the reference voltage, the capacitor $C_{2a}$ is charged to an increasing voltage $VC_{3a}$, while the capacitor $C_{2b}$ is charged to a decreasing voltage $VC_{3b}$. Two buffers B1 and B2 coupled to the respective hold capacitors feed the voltage supplies to a voltage adder that generates an output voltage having a full dynamic range, and corresponds to the difference between the two voltages $VC_{3a}$ and $VC_{3b}$.

Alternatively, the circuit of the invention may include a comparator for the voltages Vin and Vref for producing a signal SIGN_VIN that is fed to the control logic as an indication of the current ratio between the input voltage and the voltage reference.

If the continuous component of the input voltage is equal to the voltage reference, as shown in the example, the voltages on the two hold capacitors will reach their respective maximum values during consecutive half-periods of integration. However, if the continuous component of Vin does not coincide with Vref, one of the two voltages $VC_{3a}$ or $VC_{3b}$ will reach its respective maximum value before the other, and therefore Vout will not have the maximum dynamic range.

Figure 5:
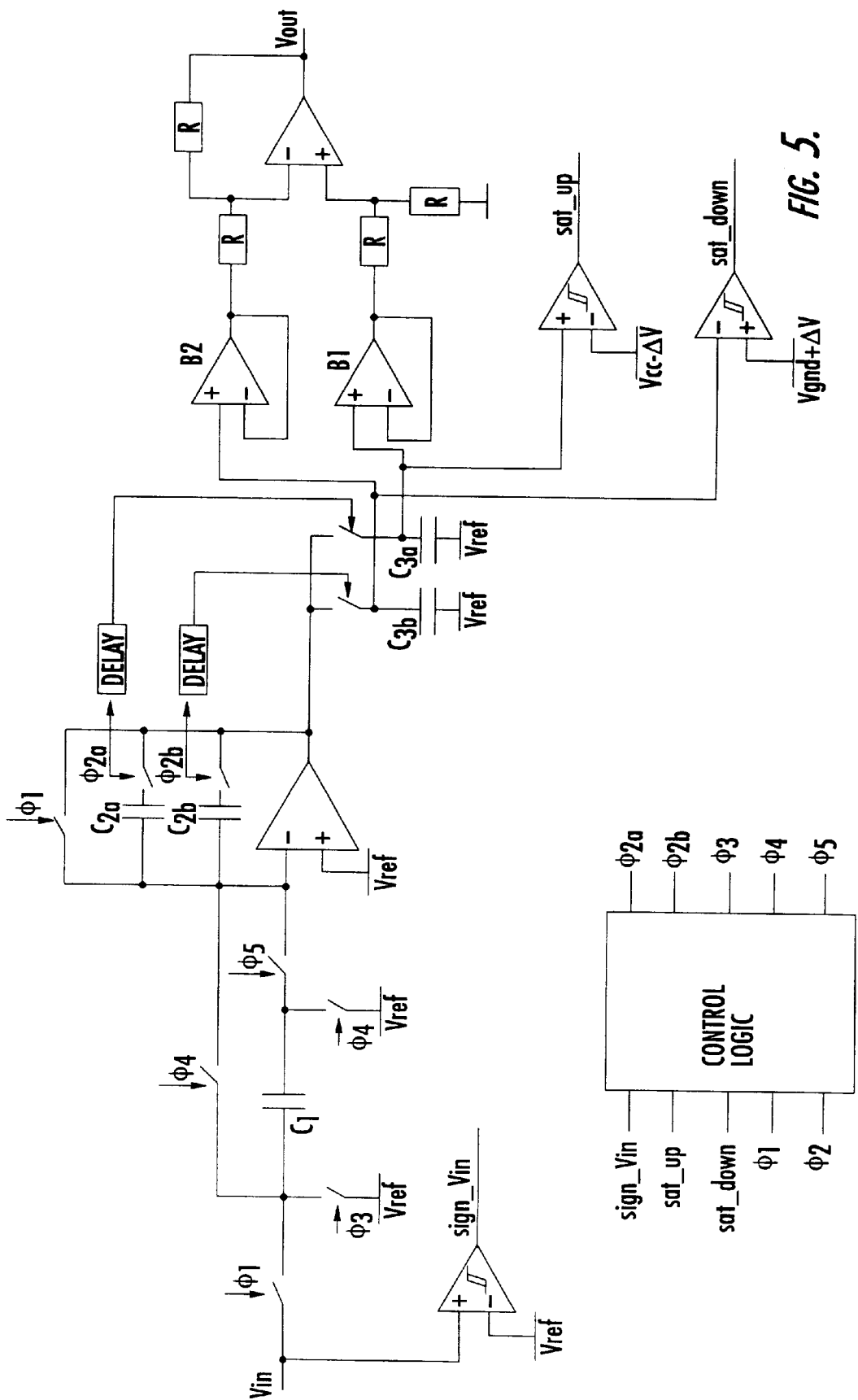
FIG. 5 is a detailed schematic diagram illustrating another embodiment of the circuit according to the present invention.

The preferred embodiment of the invention, shown in FIG. 5, may be used to prevent this problem. This circuit differs from the one of FIG. 3b in that the switched input capacitor is linked to the input line through switches driven by three sub-phases $\Phi_3$, $\Phi_4$ and $\Phi_5$ of the primary driving phase $\Phi_2$. In addition, two comparators compare the voltages of the respective hold capacitors with the limit voltages $V_{CC}-\Delta V$ and $V_{GND}+\Delta V$, and the produced signals SAT_UP and SAT_DOWN. A signal is sent to the CONTROL_LOGIC circuit when the maximum voltage (saturation) on any of the two hold capacitors is reached.

Figure 6:
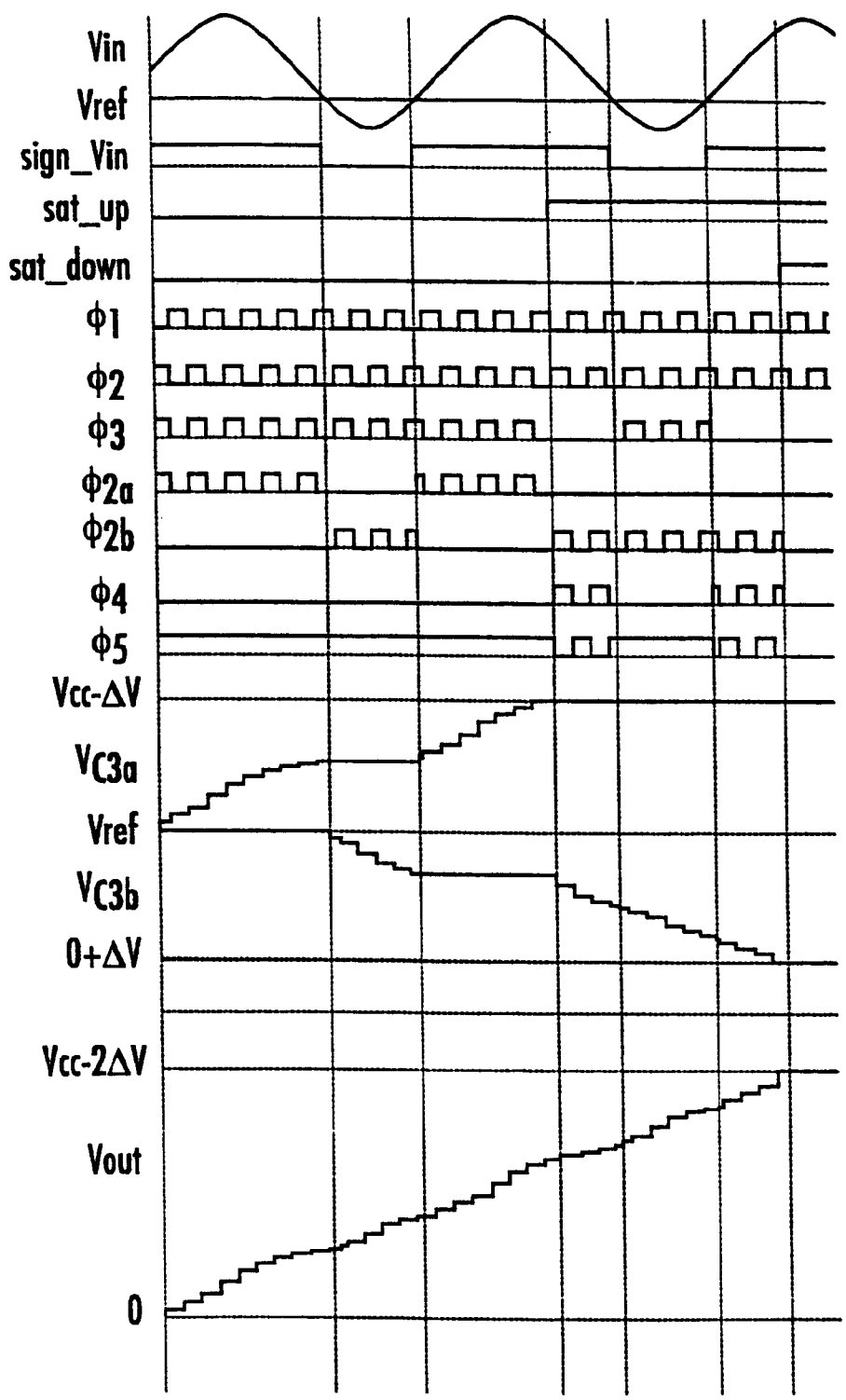
FIG. 6 is a graph illustrating the main signals of the circuit illustrated in FIG. 5.

In the signal diagrams of FIG. 6, the sub-phases $\Phi_3$ and $\Phi_4$ are complementary and the sub-phase $\Phi_5$ is in phase opposition to $\Phi_4$. As long as none of the hold capacitors are saturated, the sub-phase $\Phi_3$ coincides with $\Phi_2$ and the circuit of FIG. 5 functions as the circuit in FIG. 3b.

When any one of the two hold capacitors saturates in the example of FIG. 6, $C_{3a}$ is the first to saturate, the sub-phases $\Phi_4$ and $\Phi_5$ are modulated such that the capacitor that has not yet reached the respective maximum voltage continues to be charged, whereas the saturated capacitor ($C_{3a}$) is disconnected (phase $\Phi_{2a}$ is disabled).

When the voltage of one of the two hold capacitors reaches a saturation level, the connections of the circuit are modified such that the other hold capacitor is charged with a voltage of the same sign, regardless of the ratio between Vin and Vref. When the voltage on the other hold capacitor reaches the saturation level, the output voltage reaches its maximum value. Similarly, if the capacitor $C_{3b}$ is the first to reach saturation, it will be disconnected $\Phi_{2b}$ is disabled).

The above described circuit approach permits the combination in a unique circuit the rectifying, integrating and level shifting functions, thus eliminating the problems of the known circuits. In particular, combining in a unique block the above noted functions permits elimination of the need to use an amplifier with a gain equal to 2 connected in cascade, which according to certain prior art circuits is required to attain a full output dynamic range and to enhance signal/noise ratio.

Finally, the operational amplifier of the integrator functions with respect to the voltage reference in such a way as to ensure that the discharge of the parasitic capacitances of the switches, due to their intrinsically small value, will not bring the amplifier of the integrator to function at a below ground voltage Vgnd.

What is claimed is:

1. A rectifying integrator for an input signal with full output dynamics, relative to a voltage reference intermediate with respect to the dynamics of the input signal, the rectifying integrator comprising:
   at least one integrator;
   a first line of integration connected to said at least one integrator for integrating a portion of the input signal that exceeds the voltage reference, said first line of integration comprising a first hold capacitor coupled in cascade to said at least one integrator;
   a second line of integration connected to said at least one integrator for integrating a portion of the input signal that remains below the voltage reference, said second line of integration comprising a second hold capacitor coupled in cascade to said at least one integrator; and
   an adder output stage for generating an output signal equal to a difference between voltages existing on said first and second hold capacitors.

2. A rectifying integrator according to claim 1, wherein said at least one integrator comprises a common offset free switched-capacitor integrator shared by said first and second lines of integration, and having an input for receiving the voltage reference; and said rectifying integrator further comprising a control circuit for generating a first primary control phase signal and a second primary control phase signal in phase opposition to each other for offset compensation and integration of said common offset free switched-capacitor integrator.

3. A rectifying integrator according to claim 2, wherein said common offset free switched-capacitor integrator comprises:
   an operational amplifier; and
   a feedback path between an output and an input of said operational amplifier and comprising
      a first feedback capacitor, and a second feedback capacitor connected in parallel to said first feedback capacitor, and
      a first feedback switch connected in series to said first feedback capacitor, and a second feedback switch connected in series to said second feedback capacitor, said first and second feedback switches being alternately connected to the feedback path and being driven by a first pair of complementary sub-phase signals of the second primary control phase signal.

4. A rectifying integrator according to claim 3, further comprising:
   a first hold capacitor switch connected between the output of said operational amplifier and said first hold capacitor; and
   a second hold capacitor switch connected between the output of said operational amplifier and said second hold capacitor;
   said first and second hold capacitors being alternately connected to the output of said operational amplifier by said first and second hold capacitor switches being driven by the first pair of complementary sub-phase signals delayed by a time interval.

5. A rectifying integrator according to claim 4, further comprising:
   a first delay circuit connected to said first hold capacitor switch for providing the delayed time interval; and
   a second delay circuit connected to said second hold capacitor switch for providing the delayed time interval.

6. A rectifying integrator according to claim 1, further comprising:
   a first output buffer connected to said first hold capacitor; and
   a second output buffer connected to said second hold capacitor.

7. A rectifying integrator according to claim 1, further comprising:
   a first saturation comparator connected to said first hold capacitor for generating a first saturation signal if the voltage on said first hold capacitor reaches a respective saturation level; and
   a second saturation comparator connected to said second hold capacitor for generating a second saturation signal if the voltage on said second hold capacitor reaches a respective saturation level.

8. A rectifying integrator according to claim 7, wherein said control circuit generates a second pair of complementary sub-phase signals of the second primary control phase signal based upon the generated first and second saturation signals, and generates a fifth sub-phase signal of the first primary control phase signal based upon the generated first and second saturation signals, and one of the second pair of the complementary sub-phase signals is in phase opposition to the fifth sub-phase signal.

9. A rectifying integrator according to claim 8, wherein said control circuit switches one of the second pair of said complementary sub-phase signals and the fifth sub-phase signal when one of the first and second saturation signals is active, and switches one of the first pair of complementary sub-phases signals if one of said first and second hold capacitors is not saturated while the other one of said first and second hold capacitors is saturated, or if the input signal exceeds the voltage reference while both said first and second hold capacitors are not saturated.

10. A rectifying integrator comprising:
    a common offset free switched-capacitor integrator having an input for receiving a voltage reference;
    a first line of integration alternately connected to said common offset free switched-capacitor integrator for integrating a portion of the input signal that exceeds the voltage reference, said first line of integration comprising a first hold capacitor coupled in cascade to said common offset free switched-capacitor integrator;
    a second line of integration alternately connected to said common offset free switched-capacitor integrator for integrating a portion of the input signal that remains below the voltage reference, said second line of integration comprising a second hold capacitor coupled in cascade to said common offset free switched-capacitor integrator; and
    an adder output stage for generating an output signal equal to a difference between voltages existing on said first and second hold capacitors.

11. A rectifying integrator according to claim 10, further comprising a control circuit for generating a first primary control phase signal and a second primary control phase signal in phase opposition to each other for offset compensation and integration of said common offset free switched-capacitor integrator.

12. A rectifying integrator according to claim 11, wherein said common offset free switched-capacitor integrator comprises:
    an operational amplifier; and
    a feedback path between an output and an input of said operational amplifier and comprising
       a first feedback capacitor, and a second feedback capacitor connected in parallel to said first feedback capacitor, and
       a first feedback switch connected in series to said first feedback capacitor, and a second feedback switch connected in series to said second feedback capacitor, said first and second feedback switches being alternately connected to the feedback path and being driven by a first pair of complementary sub-phase signals of the second primary control phase signal.

13. A rectifying integrator according to claim 12, further comprising:
    a first hold capacitor switch connected between the output of said operational amplifier and said first hold capacitor; and
    a second hold capacitor switch connected between the output of said operational amplifier and said second hold capacitor;
    said first and second hold capacitors being alternately connected to the output of said operational amplifier by said first and second hold capacitor switches being driven by the first pair of complementary sub-phase signals delayed by a time interval.

14. A rectifying integrator according to claim 13, further comprising:
    a first delay circuit connected to said first hold capacitor switch for providing the delayed time interval; and a second delay circuit connected to said second hold capacitor switch for providing the delayed time interval.

15. A rectifying integrator according to claim 10, further comprising:
   a first output buffer connected to said first hold capacitor; and
   a second output buffer connected to said second hold capacitor.

16. A rectifying integrator according to claim 10, further comprising:
   a first saturation comparator connected to said first hold capacitor for generating a first saturation signal if the voltage on said first hold capacitor reaches a respective saturation level; and
   a second saturation comparator connected to said second hold capacitor for generating a second saturation signal if the voltage on said second hold capacitor reaches a respective saturation level.

17. A rectifying integrator according to claim 16, wherein said control circuit generates a second pair of complementary sub-phase signals of the second primary control phase signal based upon the generated first and second saturation signals, and generates a fifth sub-phase signal of the first primary control phase signal based upon the generated first and second saturation signals, and one of the second pair of the complementary sub-phase signals is in phase opposition to the fifth sub-phase signal.

18. A rectifying integrator according to claim 11, wherein said control circuit switches one of the second pair of said complementary sub-phase signals and the fifth sub-phase signal when one of the first and second saturation signals is active, and switches one of the first pair of complementary sub-phases signals if one of said first and second hold capacitors is not saturated while the other one of said first and second hold capacitors is saturated, or if the input signal exceeds the voltage reference while both said first and second hold capacitors are not saturated.

19. A rectifying integrator comprising:
   an operational amplifier having a first input for receiving a voltage reference;
   a feedback path between an output and a second input of said operational amplifier and comprising
      a first feedback capacitor, and a second feedback capacitor connected in parallel to said first feedback capacitor, and
      a first feedback switch connected in series to said first feedback capacitor, and a second feedback switch connected in series to said second feedback capacitor;
   a first line of integration alternately connected to said operational amplifier for integrating a portion of the input signal that exceeds the voltage reference, said first line of integration comprising a first hold capacitor coupled to the output of said operational amplifier;
   a second line of integration alternately connected to said operational amplifier for integrating a portion of the input signal that remains below the voltage reference, said second line of integration comprising a second hold capacitor coupled to the output of said operational amplifier; and
   an adder output stage for generating an output signal equal to a difference between voltages existing on said first and second hold capacitors.

20. A rectifying integrator according to claim 19, further comprising a control circuit for generating a first primary control phase signal and a second primary control phase signal in phase opposition to each other for offset compensation and integration of said operational amplifier.

21. A rectifying integrator according to claim 20, wherein said first and second feedback switches are alternately connected to the feedback path and are driven by a first pair of complementary sub-phase signals of the second primary control phase signal.

22. A rectifying integrator according to claim 21, further comprising:
   a first hold capacitor switch connected between the output of said operational amplifier and said first hold capacitor; and
   a second hold capacitor switch connected between the output of said operational amplifier and said second hold capacitor;
   said first and second hold capacitors being alternately connected to the output of said operational amplifier by said first and second hold capacitor switches being driven by the first pair of complementary sub-phase signals delayed by a time interval.

23. A rectifying integrator according to claim 22, further comprising:
   a first delay circuit connected to said first hold capacitor switch for providing the delayed time interval; and
   a second delay circuit connected to said second hold capacitor switch for providing the delayed time interval.

24. A rectifying integrator according to claim 19, further comprising:
   a first output buffer connected to said first hold capacitor; and
   a second output buffer connected to said second hold capacitor.

25. A rectifying integrator according to claim 19, further comprising:
   a first saturation comparator connected to said first hold capacitor for generating a first saturation signal if the voltage on said first hold capacitor reaches a respective saturation level; and
   a second saturation comparator connected to said second hold capacitor for generating a second saturation signal if the voltage on said second hold capacitor reaches a respective saturation level.

26. A rectifying integrator according to claim 25, wherein said control circuit generates a second pair of complementary sub-phase signals of the second primary control phase signal based upon the generated first and second saturation signals, and generates a fifth sub-phase signal of the first primary control phase signal based upon the generated first and second saturation signals, and one of the second pair of the complementary sub-phase signals is in phase opposition to the fifth sub-phase signal.

27. A rectifying integrator according to claim 26, wherein said control circuit switches one of the second pair of said complementary sub-phase signals and the fifth sub-phase signal when one of the first and second saturation signals is active, and switches one of the first pair of complementary sub-phases signals if one of said first and second hold capacitors is not saturated while the other one of said first and second hold capacitors is saturated, or if the input signal exceeds the voltage reference while both said first and second hold capacitors are not saturated.

28. A method for rectifying and integrating an input signal comprising:
   integrating a portion of the input signal that exceeds a voltage reference using a first line of integration connected to at least one integrator, the first line of integration comprising a first hold capacitor coupled in cascade to the at least one integrator;

integrating a portion of the input signal that remains below the voltage reference, the second line of integration comprising a second hold capacitor coupled in cascade to the at least one integrator; and generating an output signal equal to a difference between voltages existing on the first and second hold capacitors.

29. A method according to claim 28, wherein the at least one integrator comprises a common offset free switched-capacitor integrator shared by the first and second lines of integration, and having an input for receiving the voltage reference; the method further comprising generating a first primary control phase signal and a second primary control phase signal in phase opposition to each other for offset compensation and integration of the common offset free switched-capacitor integrator.

30. A method according to claim 29, wherein the common offset free switched-capacitor integrator comprises:

an operational amplifier; and a feedback path between an output and an input of the operational amplifier and comprising a first feedback capacitor, and a second feedback capacitor connected in parallel to the first feedback capacitor, and a first feedback switch connected in series to the first feedback capacitor, and a second feedback switch connected in series to the second feedback capacitor, the first and second feedback switches being alternately connected to the feedback path and being driven by a first pair of complementary sub-phase signals of the second primary control phase signal.

31. A method according to claim 30, wherein the first line of integration comprises a first hold capacitor switch connected between the output of the operational amplifier and the first hold capacitor; and wherein the second line of integration comprises a second hold capacitor switch connected between the output of the operational amplifier and the second hold capacitor; the method further comprising alternately connecting the first and second hold capacitors to the output of the operational amplifier by the first and second hold capacitor switches being driven by the first pair of complementary sub-phase signals delayed by a time interval.

32. A method according to claim 31, further comprising:

delaying the first hold capacitor switch for providing the delayed time interval; and delaying the second hold capacitor switch for providing the delayed time interval.

33. A method according to claim 28, further comprising:

generating a first saturation signal if the voltage on the first hold capacitor reaches a respective saturation level; and generating a second saturation signal if the voltage on the second hold capacitor reaches a respective saturation level.

34. A method according to claim 33, further comprising generates a second pair of complementary sub-phase signals of the second primary control phase signal based upon the generated first and second saturation signals, and generating a fifth sub-phase signal of the first primary control phase signal based upon the generated first and second saturation signals, and one of the second pair of the complementary sub-phase signals is in phase opposition to the fifth sub-phase signal.

35. A method according to claim 34, further comprising switching one of the second pair of the complementary sub-phase signals and the fifth sub-phase signal when one of the first and second saturation signals is active, and switching one of the first pair of complementary sub-phases signals if one of the first and second hold capacitors is not saturated while the other one of the first and second hold capacitors is saturated, or if the input signal exceeds the voltage reference while both the first and second hold capacitors are not saturated.

* * * * *